United States Patent [19]

Longo et al.

[11] Patent Number: 5,574,452
[45] Date of Patent: Nov. 12, 1996

[54] SINGLE BIT BANDPASS ANALOG-TO-DIGITAL CONVERTER

[75] Inventors: Lorenzo L. Longo, Dove Canyon; Raouf Halim, Laguna Niguel; Bor-Rong Horng, Mission Viejo, all of Calif.

[73] Assignee: Rockwell International Corporation, Seal Beach, Calif.

[21] Appl. No.: 196,354

[22] Filed: Feb. 15, 1994

[51] Int. Cl.$^6$ ...................................................... H03M 3/02
[52] U.S. Cl. ............................................ 341/143; 341/172
[58] Field of Search ..................................... 341/143, 172

[56] References Cited

U.S. PATENT DOCUMENTS

| | | | |
|---|---|---|---|
| 4,999,634 | 3/1991 | Brazdrum et al. | 341/172 |
| 5,027,120 | 6/1991 | Thurston | 341/143 |
| 5,057,839 | 10/1991 | Koch | 341/143 |
| 5,140,325 | 8/1992 | Yu et al. | 341/143 |
| 5,148,166 | 9/1992 | Ribner | 341/143 |
| 5,298,900 | 3/1994 | Mauthe et al. | 341/143 |
| 5,305,004 | 4/1994 | Fattaruso | 341/120 |
| 5,357,252 | 10/1994 | Ledzius et al. | 341/143 |
| 5,442,353 | 8/1995 | Jackson | 341/143 |

*Primary Examiner*—Marc S. Hoff
*Attorney, Agent, or Firm*—George A. Montanye; Charles T. Silberberg; Tom Streeter

[57] ABSTRACT

A single bit bandpass analog-to-digital converter has an analog summer, an analog bandpass filter, a single bit quantizer, and a single bit digital-to-analog converter connected in a loop. An input signal to the single bit filter is applied to a plus input terminal of the summer, and the output of the digital-to-analog converter is applied to a minus input terminal of the summer. The output signal from the single bit filter is taken from the output of the quantizer. The bandpass filter is preferably driven by a digital clock running at the same frequency as the quantizer and the digital-to-analog converter. This architecture reduces quantization noise within the passband at the possible expense of increasing it outside the passband. The passband is centered precisely on one-quarter of the clock frequency.

14 Claims, 8 Drawing Sheets

FIG. 11 much data has been correctly identified, thought is required only for the passband itself, 1,785 MHz to 1,815

SINGLE BIT BANDPASS ANALOG-TO-DIGITAL CONVERTER

RELATED APPLICATION

This application is related to application Ser. No. 08/196, 328 by the same applicants, assigned to the same assignee, filed concurrently herewith, and entitled "Component Insensitive, Analog Bandpass Filter". The disclosure of the related application is incorporated herein by reference.

BACKGROUND OF THE INVENTION

This invention relates to wireless digital telephony. In one aspect, it provides a single bit bandpass analog-to-digital converter for extracting lower frequency digital signals modulating a higher frequency carrier. In another aspect, it provides a component insensitive, analog bandpass filter. This filter is not only a preferred embodiment of one of the elements of the single bit bandpass analog-to-digital converter, but also is useful in purely analog applications, especially those in which the passband must be precisely centered on a specific frequency.

Figure 1:
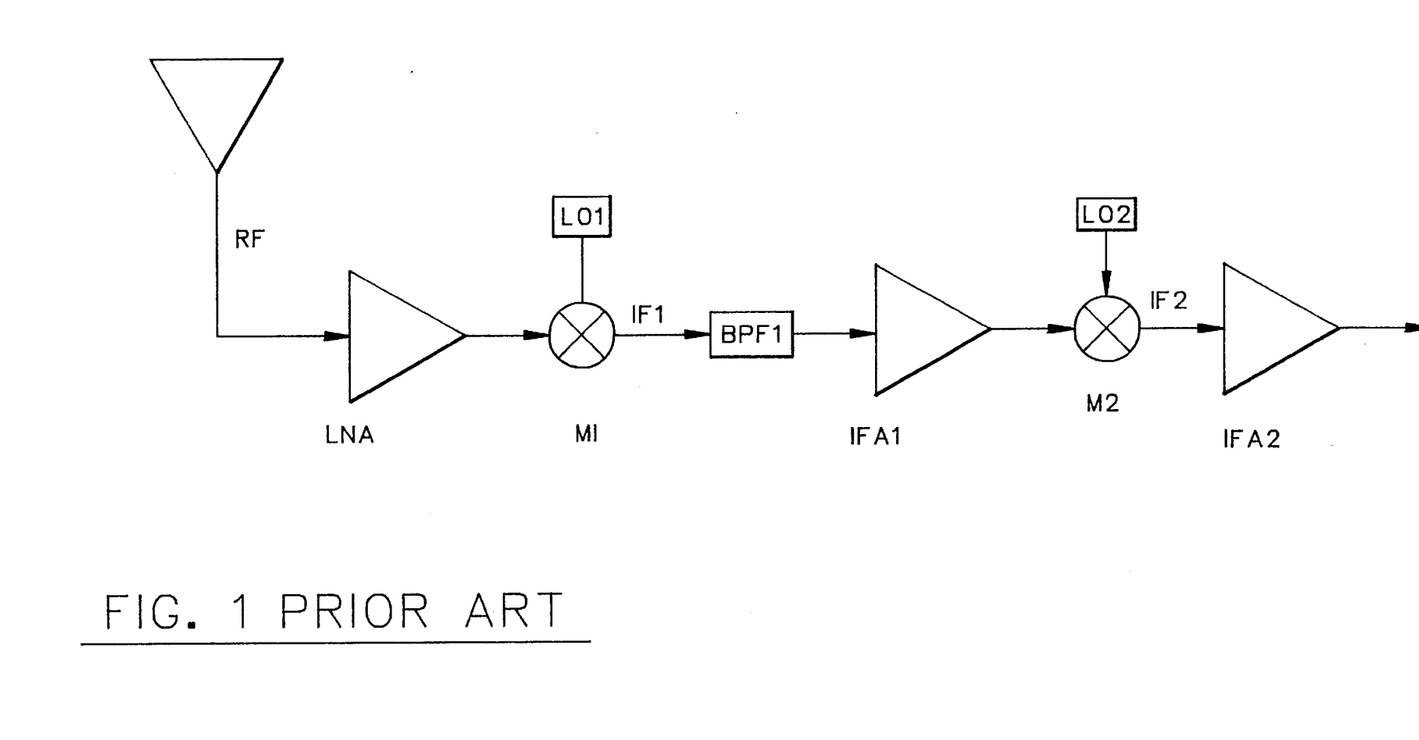
FIG. 1 is a schematic diagram of the front end of a wireless digital telephone.

In digital telephony, the radio frequency RF modulated by the digital signal is very high, perhaps 900 MHz. As shown in FIG. 1, this modulated signal is passed through a low noise amplifier LNA and fed to a first mixer M1. The first mixer M1 also receives a signal from a first local oscillator LO1, which differs in frequency from RF by a first intermediate frequency IF1. If IF1 is 100 MHz, as is typical, then LO1 has a frequency of either 800 MHz or 1 GHz. In either event M1 produces an IF1 output, still modulated by the digital signal.

The IF1 signal is passed through a first bandpass filter BPF1, amplified by a first intermediate frequency amplifier IFA1, and mixed in a second mixer M2 with the output of a second local oscillator LO2. IFA1 must have good fidelity, but not the extreme fidelity of LNA; this is the reason for the two amplification stages. LO2 has a frequency which differs from IF1 by a second intermediate frequency IF2. If IF2 is 1.8 MHz, as is typical, then LO2 has a frequency of either 101.8 MHz or 98.2 MHz. In either event M2 produces an IF2 output, still modulated by the digital signal. This is amplified by a second intermediate frequency amplifier IFA2.

Figure 2:
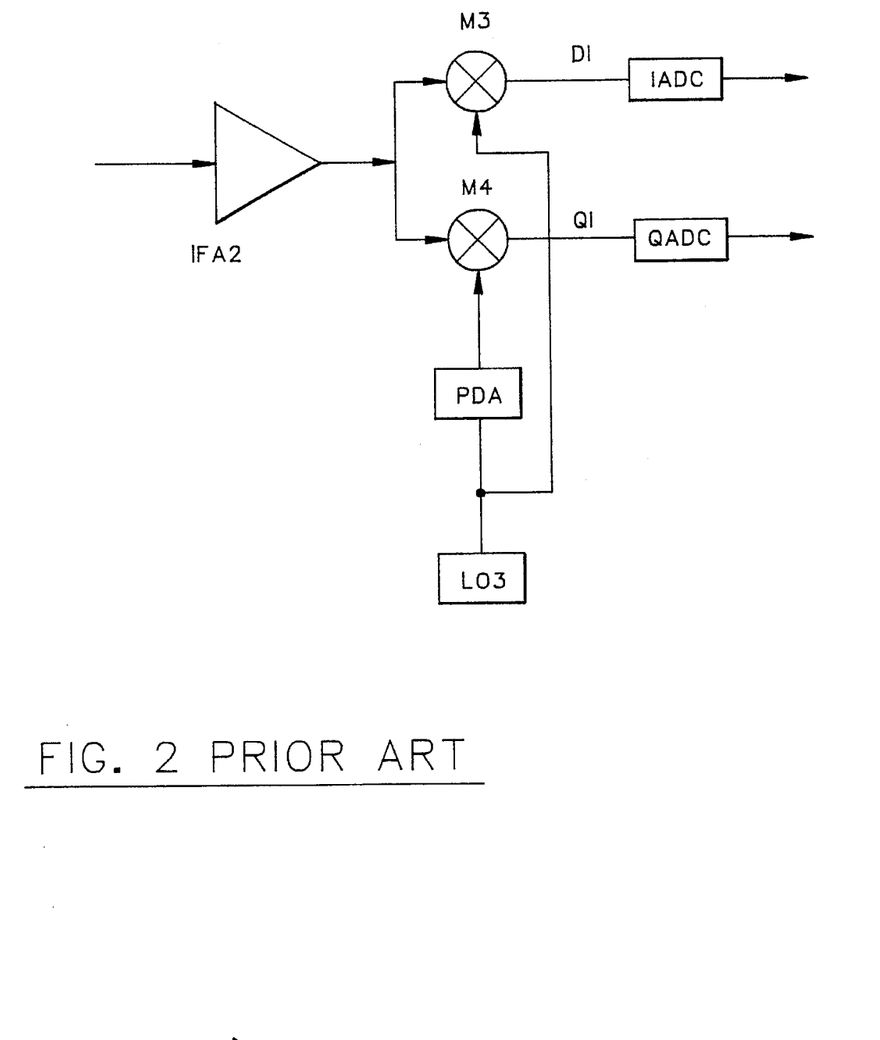
FIG. 2 is a schematic diagram of one form of the apparatus which is, in the prior art, driven by the front end shown in FIG. 1.

Conventional processing at this stage is shown in FIG. 2. The signal from IFA2 is fed to both a third mixer M3 and to a fourth mixer M4. A third local oscillator LO3, also producing a signal at IF2, is fed to both mixers, thereby demodulating the digital signal entirely. In the case of M4, LO3's signal first passes through a 90 degree phase delay apparatus PDA. The output of M3 is therefore a demodulated inphase signal DI, and the output of M4 is a demodulated quadrature signal DQ. These are respectively digitized by an inphase analog-to-digital converter IADC and a quadrature analog-to-digital converter QADC.

Figure 3:
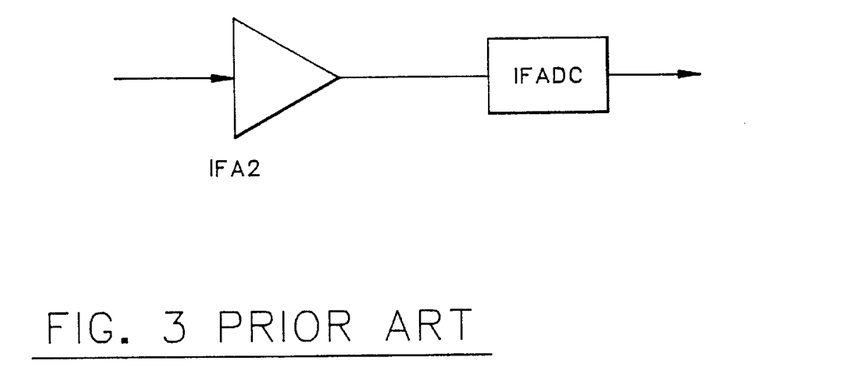
FIG. 3 is a schematic diagram of a second form of the apparatus which is, in the prior art, driven by the front end shown in FIG. 1.

As shown in FIG. 3, LO3, M3, PDA and M4 can be eliminated and the signal from IFA2 can be fed directly to an intermediate frequency analog-to-digital converter IFADC. This is often desired, since LO3, M3, PDA, and M4 are expensive and cumbersome. Inphase and quadrature demodulation then takes place in the digital domain.

Demodulated signals DI and DQ need to have as broad a bandwidth as the human ear, but no broader. 15 KHz is ample. Even allowing for negative frequencies, a band from −15 KHz to +15 KHz is only 30 KHz wide.

This presents a design opportunity. The conventional IFADC of FIG. 3 has good fidelity from 0 Hz all the way to the top of the passband, 1,815 MHz, even though fidelity is required only for the passband itself, 1,785 MHz to 1,815 MHz. If the noise which inevitably attends the digitization process can be excluded from this narrow passband, it makes no difference that the noise outside this passband is retained, or even increases. The prior art, in keeping noise out of the passband, was forced to keep it out of all lower frequencies as well. This was not cost-effective, and presented problems of size, weight, and power consumption as well.

The bandpass analog-to-digital converter contemplated for doing this can have an output of as little as a single bit. Such a converter can very conveniently be mechanized using a component insensitive analog bandpass filter. Such a filter would have applications far removed from digital telephony. It could be used even in purely analog applications, provided that the passband was required to be precisely centered on a digital frequency.

SUMMARY OF THE INVENTION

A single bit bandpass analog-to-digital converter has an analog summer, an analog bandpass filter, a single bit quantizer, and a single bit digital-to-analog converter connected in a loop. An input signal to the single bit filter is applied to a plus input terminal of the summer, and the output of the single bit digital-to-analog converter is applied to a minus input terminal of the summer. If the filter is an inverting filter, the output of the single bit digital-to-analog converter is applied to a plus input terminal of the summer. The output signal from the single bit filter is taken from the output of the quantizer.

The bandpass filter is preferably driven by a digital clock running at the same frequency as the quantizer and the digital-to-analog converter. This architecture reduces quantization noise within the passband at the possible expense of increasing it outside the passband. The passband of a filter so driven is centered precisely on one-quarter of the clock frequency. This centers the passband of the bandpass converter at the same frequency.

The component insensitive analog bandpass filter preferably used in the above converter has an analog summer and two analog delay elements connected in a loop. An input signal to the filter is applied to a plus input terminal of the summer, and the output of the second delay elements is applied to a minus input terminal of the summer. The output of filter may be taken either from the output of the summer, or from the output of the second delay element, or from any point In between. Such a loop produces an inverting filter. Accordingly, in a bandpass converter referred to above using such a filter, the output of the single bit digital-to-analog converter is applied to a plus input terminal of the summer.

Each delay element is driven by a two phase non-overlapping clock, and each element passes a charge from a first capacitor through an op amp to either a second capacitor (first phase) or a third capacitor (second phase). Amplification may be provided by adjusting the ratio of the second (or third) capacitor to the first capacitor. If a differential op amp is used, both sides of the op amp are clocked together, and each side has its own trio of capacitors identical to the trio on the other side. The passband is centered precisely on one-quarter of the clock frequency, thereby rendering it very useful for the above bandpass converter.

The bandpass filter and bandpass converter referred to above contemplate an IF carrier frequency of 1.8 MHz and a bandwidth of 30 KHz. These figures are examples only; these inventions are suitable whenever the bandwidth is a small fraction of the carrier frequency.

DETAILED DESCRIPTION OF THE DRAWINGS

FIGS. 1, 2, and 3 show the prior art, and have been discussed in the "Background of the Invention".

Figure 4:
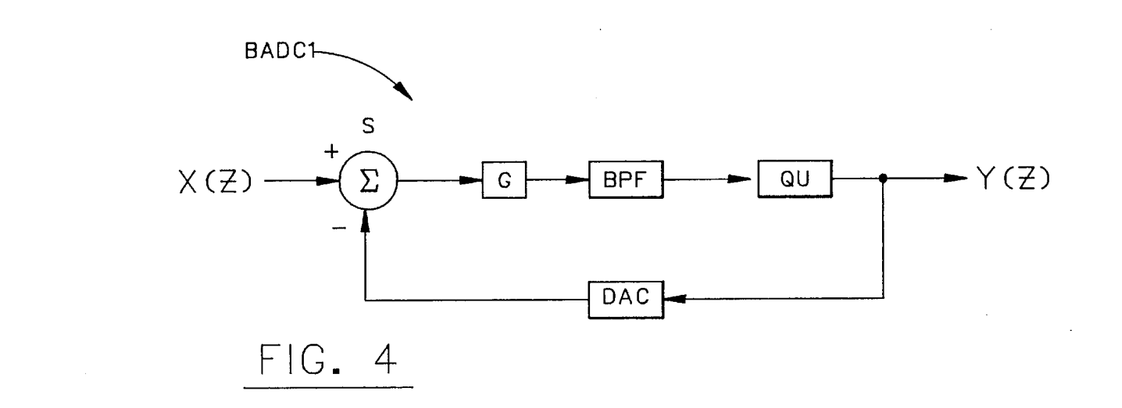
FIG. 4 is an overview block diagram of a novel single stage single bit bandpass analog-to-digital converter.

FIG. 4 is an Overview block diagram of a novel single stage single bit bandpass analog-to-digital converter BADC1. In FIG. 4 a summer S, gain stage G, bandpass filter BPF, quantizer (or single bit analog-to-digital converter) QU, and single bit digital-to-analog converter DAC are connected in a loop. S receives an input signal $X(z)$ at a plus input terminal and the output of DAC at a minus terminal. The output of QU is also the output of BADC1 and produces an output signal $Y(z)$. Let g be the gain of gain stage G. Then $0<g\leq 1$.

DAC is shown as driving a minus input to S to emphasize that this is a negative feedback loop. If BPF is an inverting filter, then the output of DAC would be applied to a plus input of S.

Figure 5:
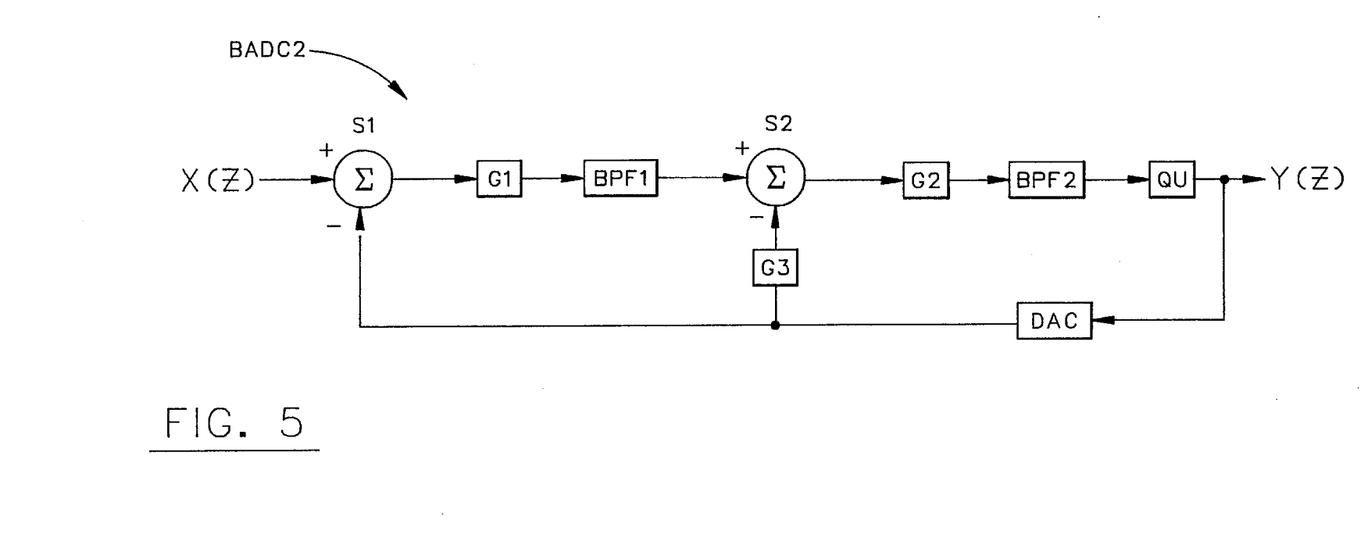
FIG. 5 is a block diagram of a double stage embodiment of the converter shown in FIG. 4.

FIG. 5 is an overview block diagram of a novel double stage single bit bandpass analog-to-digital converter BADC2. In FIG. 5, a first summer S1, first gain stage G1, first bandpass filter BPF1, second summer S2, second gain stage G2, second bandpass filter BPF2, quantizer (or single bit analog-to-digital converter) QU, and single bit digital-to-analog converter DAC are connected in a loop. DAC is connected to S1 directly (at a minus input terminal), but first passes through a third gain stage G3 before being connected to a minus input terminal of S2. An input signal $X(z)$ is applied to a plus terminal of S1, and an output signal $Y(z)$ is produced from the output of QU.

Let g1 be the gain of first gain stage G1, and let g2 be the gain of second gain stage G2. Then $0<g1\leq 1$, and $0<g2\leq 1$. g1 and g2 are selected to be low enough that the op amps (see FIG. 8) used to mechanize them will not be driven into an overvoltage condition, but high enough that noise will be insignificant. Applicants have obtained good results with $g1=\frac{1}{3}$ and $g2=\frac{3}{4}$.

As in FIG. 4, FIG. 5's summers S1 and S2 are shown as being driven at minus input terminals by DAC or G3. If $g3<0$ or BPF2 is an inverting filter (but not both), then the output of G3 would be applied to a plus input terminal of S1. Likewise, If either BPF1 or BPF2 is an inverting filter (but not both), then the output of DAC would be applied to a plus input terminal of S2. The loops both through BPF1 and BPF2 will thereby retain their negative feedback character.

Figure 6:
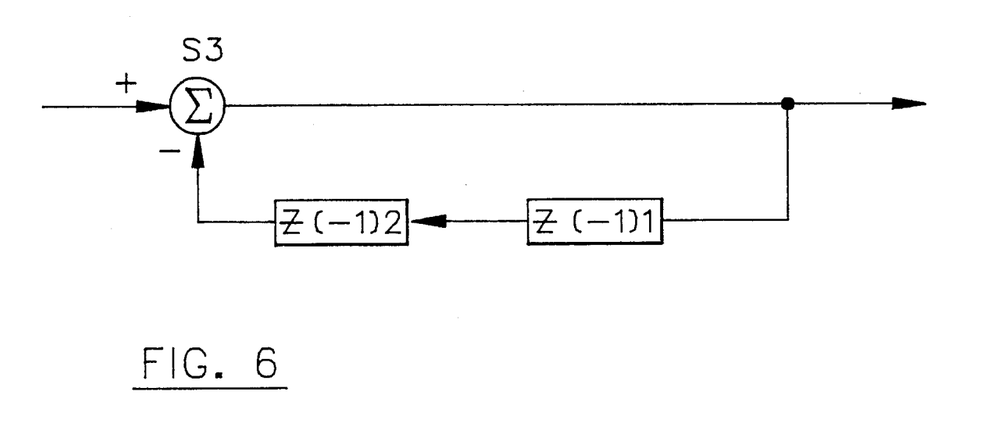
FIG. 6 is a block diagram of a first delay apparatus architecture of the filters used in the converters of FIGS. 4 and 5.
Figure 7:
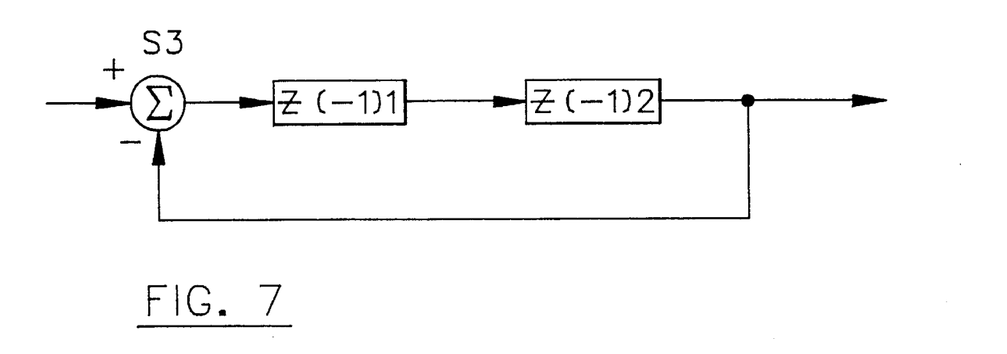
FIG. 7 is a block diagram of a second delay apparatus architecture of the filters used in the converters of FIGS. 4 and 5.

FIGS. 6 and 7 both show the internal architecture of a bandpass filter, such as BPF, BPF1 or BPF2. In these filters, a third summer S3 and a pair of delay elements $Z(-1)1$ and $Z(-1)2$ are arranged in a loop, with the second delay element $Z(-1)2$ driving a minus input terminal of S3 and an input signal driving a plus input terminal of S3. In the FIG. 6 filter, the output of the filter is taken at the output of S3. In the FIG. 7 filter, the output of the filter is taken at the output of $Z(-1)2$.

The delay imposed by the filter as a whole is the delay imposed by the components between the output of the summer S3 and the output of the filter as a whole. This can vary from no delay (FIG. 6) to a delay of two clock cycles (FIG. 7).

Figure 8:
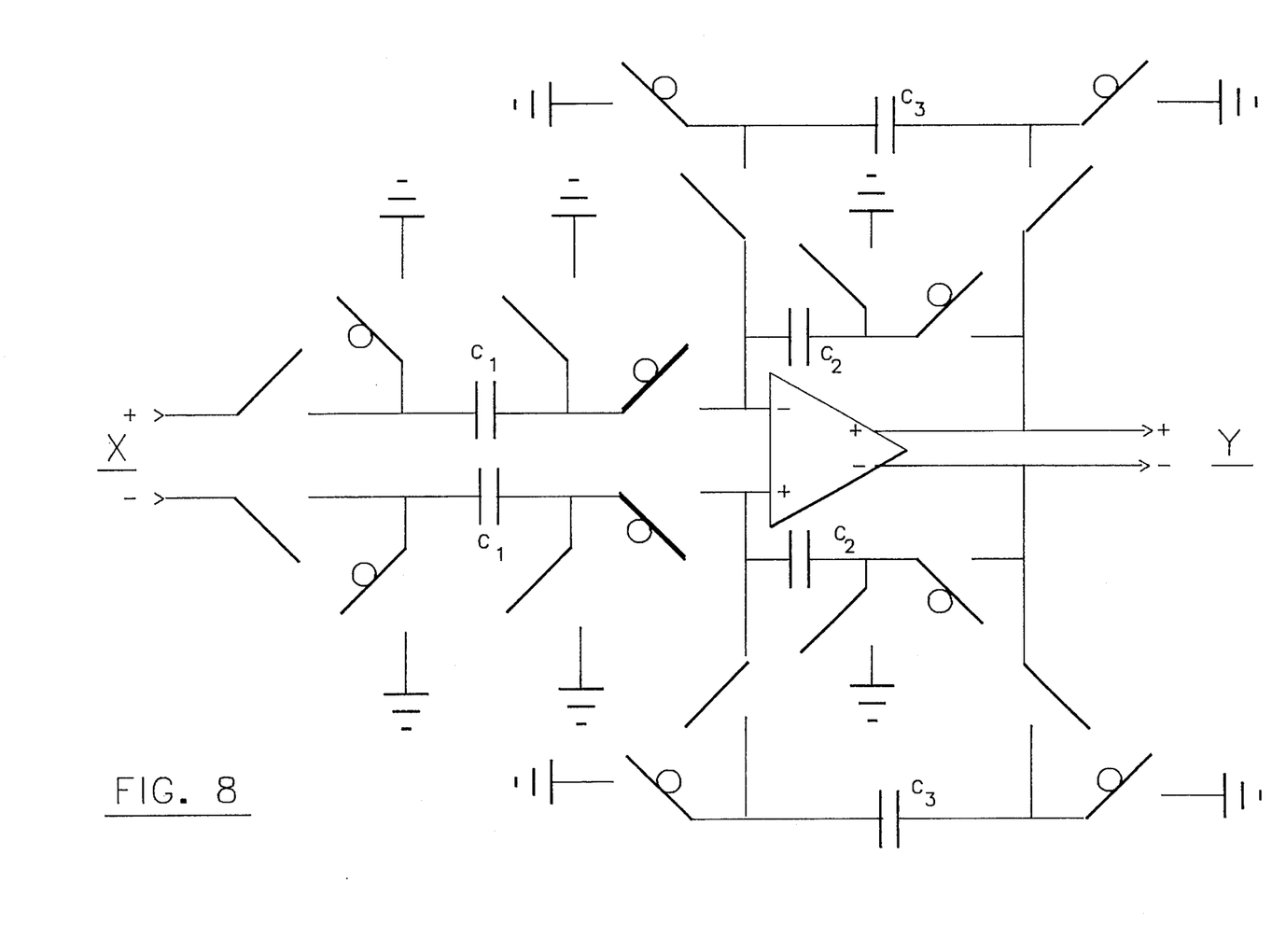
FIG. 8 shows the interior of the delay elements shown in FIGS. 6 and 7.

FIG. 6 and FIG. 7 represent extreme architectures for the output tap of a bandpass filter. The output tap could be placed between the delay elements $Z(-1)1$ and $Z(-1)2$, thereby providing an overall filter delay of one cycle. Indeed, the output tap could be placed even within a delay element, provided only that the total delay around the loop equals two clock signals. It is relatively straightforward to mechanize such a fractional delay tapping, at least if apparatus similar to that shown in FIG. 8 is used. FIG. 8, and the timing diagram shown in FIG. 9, contemplate a two phase non-overlapping clock. If the input uses Q1, the output can use Q2, and thereby obtain a half clock signal.

In the single stage converter of FIG. 4, any combination of FIG. 6 and FIG. 7 filters, or of filters between the extremes shown in FIG. 6 and FIG. 7, may be used for BPF. However, the loop through DAC, G, S, BPF and QU must have a total delay of two clock cycles. If insufficient delay is provided within BPF, additional delay elements (including half delay elements, as described above in exploiting Q1 and Q2) may be inserted anywhere else In the loop to cause the total delay through the loop to assume the correct value: two. For example, the gain stage G may include additional delay apparatus to increase the delay. Alternatively, DAC may be configured to have an additional delay. Other expedients will occur to those skilled in the art.

In the double stage converter of FIG. 5, any combination of FIG. 6 and FIG. 7 filters, or of filters between the extremes shown In FIG. 6 and FIG. 7, may be used for BPF1 and BPF2. There are, however, two limitations on the previous sentence. First, the small loop through DAC, G3, S2, G2, BPF2 and QU must have a total delay of two clock cycles. Second, the large loop through DAC, S1, G1, BPF1, S2, G2, BPF2 and QU must have a total delay of either two or four clock cycles. To the extent that either filter takes its output from a tap nearer the output of the summer (see FIG. 6 and FIG. 7), the other filter must take It nearer the output of the second delay element $Z(-1)2$, and vice versa.

Adjusting both filters may be impractical. If so, additional delay elements (including half delay elements, as described above in exploiting Q1 and Q2) may be inserted anywhere else in the loops to cause the total delay through both loops to assume the correct values. For example, third gain stage G3 may include additional delay apparatus to increase the delay of the smaller loop without affecting the delay of the larger loop; first gain stage G1 may be similarly modified to reverse this effect. Alternatively, DAC may be configured to have separate outputs for the two loops, with separate delays in each output. Other expedients will occur to those skilled in the art.

g3 depends on g1. If the delay around both the large loop and the small loop is two clock cycles, then g3=g1. If the delay around the large loop is four clock cycles and the delay around the small loop is two clock cycles, then g3=–2 g1.

Figure 9:
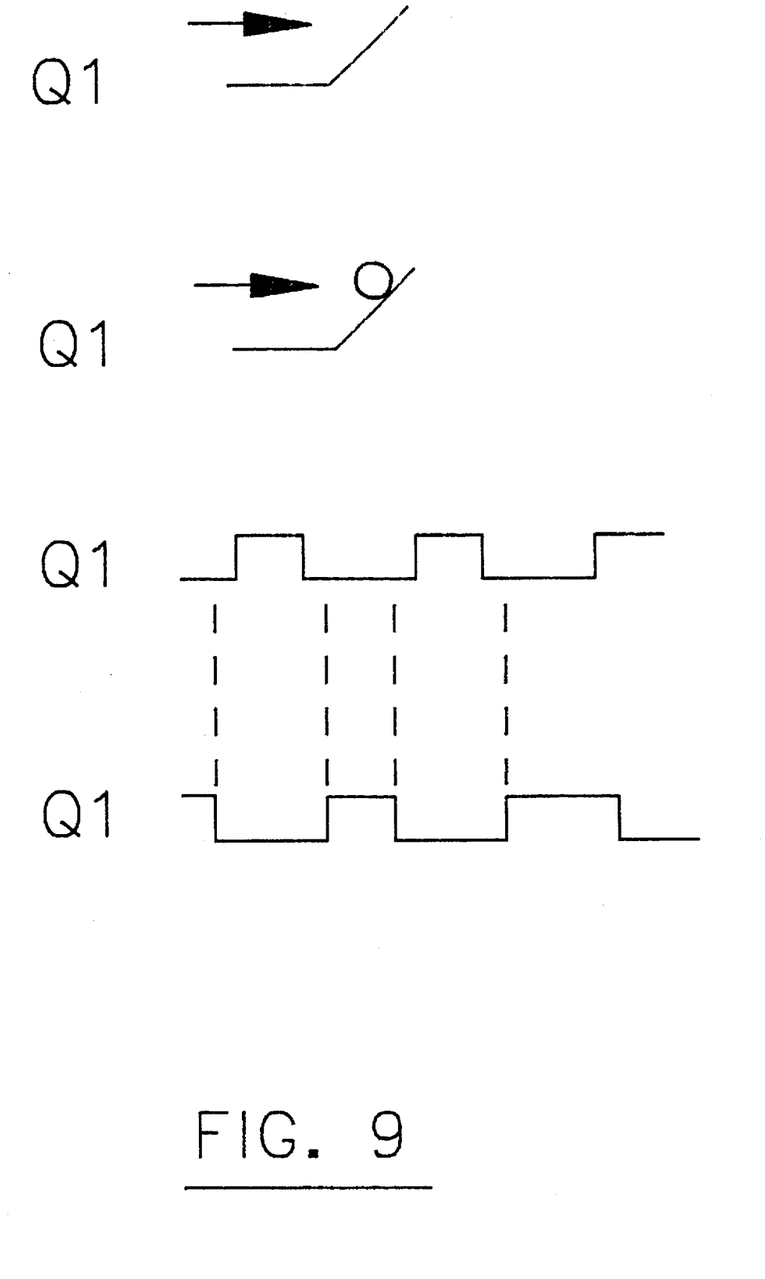
FIG. 9 is a timing diagram for the operation of the delay elements of FIG. 8.

FIG. 8 shows the interior of the delay elements shown in FIGS. 6 and 7. FIG. 9 is a timing diagram for the operation of the delay elements of FIG. 8. The switches of FIG. 8 without circles are closed when first clock signal Q1 is high; those with circles are closed when second clock signal Q2 is high. As shown in FIG. 9, these two signals form a two phase non-overlapping clock.

The operation of the FIG. 8 apparatus is straightforward. When the Q1 switches are closed, a fully differential input signal X charges the left sides of first capacitors C1, while the right sides are grounded. A half cycle later, the Q1 switches are opened and the Q2 switches are closed. This grounds the left sides of C1 while the right sides charge the inputs of a differential op amp DOA and the left sides of second capacitors C2, which are connected across both the input and output of DOA, and thus to the output of the delay element. A half cycle after that, the right sides of C2 are grounded and the charge flows to the left sides of third capacitors C3, which are connected across both the input and output of DOA (and thus to the output of the delay element), while the right sides of C2 are removed from DOA's output. A half cycle after that, C3 is removed from the circuit and both sides of C3 are grounded.

Let c1, c2, and c3 be the respective capacitances of C1, C2, and C3. Then the gain during Q2 is c1/c2, and the gain during Q1 is c1/c3. The gain stages G1 and G2 may thus be mechanized in the same hardware as mechanizes the bandpass filters BPF1 and BPF2. Since the delay is preferably integral rather than fractional, and the gain is therefore preferably measured during Q2, the important ratio is c1/c2.

A differential op amp is preferred since it reduces noise. Further, when a differential op amp is used in the delay elements, the filter which incorporates the delay elements may be made an inverting filter, if desired. Equivalently, the Q1 and Q2 gains may be made negative.

Variances In manufacturing capacitors C1, C2, and C3 may cause variances in the gain stages G1, G2, and G3. However, precision in these gains, while desirable, is not critical. Importantly, manufacturing variances will not affect the center of the passband. That center is set by the clock frequency Q1 and Q2; the center of the passband is one-quarter of the frequency of the clock. The passband center was affected by manufacturing variances in the prior art.

The sides of the passband of the individual bandpass filters BPF1 and BPF2 are not particularly steep. The sides of the passband of the overall bandpass converters BADC1 and BADC2 are somewhat steeper. In the fairly narrow band of interest, however, the response curve of both the filters and the converters are fairly flat. Once the signals have been digitized, they can be passed on to other apparatus forming no part of the present invention. In such apparatus, the passband can be digitally modulated to be centered on 0 Hz, and signals outside the passband can be digitally discarded.

Figure 10:
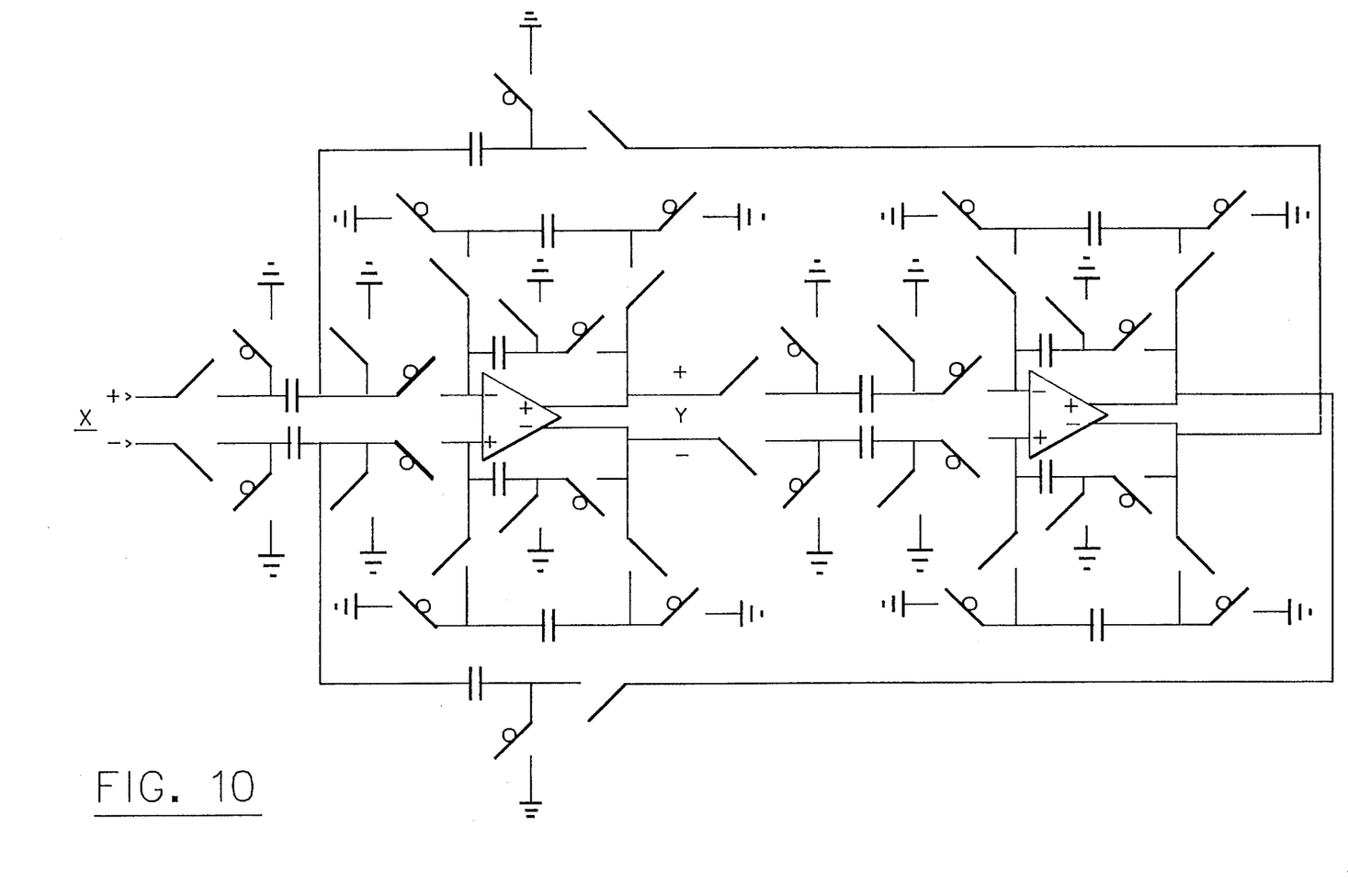
FIG. 10 shows how a summer may be included in front of two successive delay elements, with the output of the second delay element being fed back to the opposite sides of the DOA of the first delay element.

FIG. 10 shows how a summer may be included in front of two successive delay elements, with the output of the second delay element being fed back to the opposite sides of the DOA of the first delay element. The filter of FIG. 10 is therefore an inverting filter, and the summers shown in FIGS. 4 and 5 must be driven accordingly.

Figure 11:
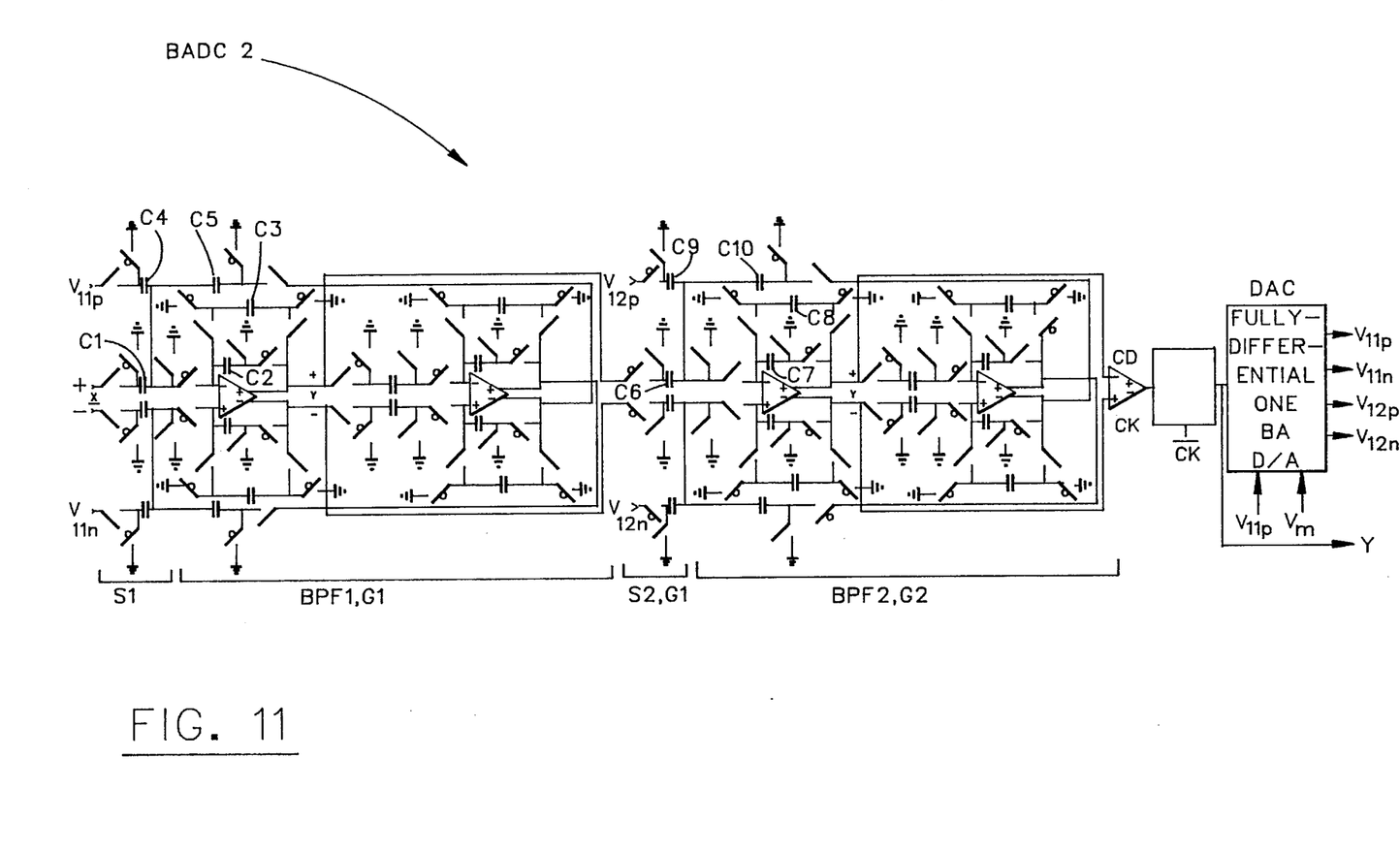
FIG. 11 shows the mechanization of the entire double stage, single bit, bandpass, analog-to-digital converter.

FIG. 11 shows the mechanization of the entire double stage, single bit, bandpass, analog-to-digital converter. The output of the second bandpass filter BPF2 is applied to a comparator CO, which is triggered by the rising edge of the inverse of clock signal Q1. The output of the comparator CO is applied to a D flip-flop, which is triggered by the rising edge of the inverse of clock signal Q2. The D flip-flop samples, at its input terminal D, the output of CO, and hold it at the output Q of the flip-flop until the next rising edge.

The output Q is the output of the entire converter BADC2. It is also fed to a fully differential one bit digital-to-analog converter DAC. This DAC also receives two references voltages, a positive reference voltage Vrp and a negative reference voltage Vrn. These voltages are taken with respect to a midrange ground. Since the op amps all preferably operate on a voltage difference between 0 V and 5 V, the ground is at 2.5 V. A convenient voltage difference between Vrp and Vrn is 1.2 V. This is easy to obtain from the silicon band gap voltage. If so obtained, it is nearly free from noise and temperature dependence. Vrp is therefore preferably 3.1 V, and Vrn is preferably 1.9 V. Other voltages may be used with other hardware.

The comparator CO is an op amp and therefore operates on the same 0 V to 5 V voltage difference that all the other op amps operate on. Being a comparator, it produces either 0 V or 5 V, thereby causing Q to present either 0 V or 5 V to the DAC. If the DAC receives 5 V from Q, then it applies Vrp to Vf1p and Vf2p, and applies Vrn to Vf1n and Vf2n; if it receives 0 V from Q, it does the reverse. These voltages are then recirculated to the summers S1 and S2 at the front ends of BPF1 and BPF2.

First summer S1 is shown at the far left side of FIG. 11, and includes input capacitors C4. As shown in FIG. 5, there is no intermediate multiplier between DAC and S1, so c4=c1. c4 may easily be varied from c1 if the user finds it convenient for the application at hand. As noted above, first gain stage G1 is conveniently mechanized within first bandpass filter BPF1, and is shown preceding BPF1 in FIG. 5 for conceptual simplicity only. The gain stage and filter may be separately mechanized if desired. Fifth capacitor C5 mechanizes the third summer S3 of FIG. 6 and 7.

BPF2 and S2 have capacitors C6, C7, C8, C9, and C10 which parallel C1, C2, C3, C4, and C5 of BPF1 and S1. Second summer S2 is mechanized by C9. In BPF1 and S1, c4=c1, since no gain stage was included between DAC and S1 (although, as noted, it could be if desired). This is not true of BPF2 and S2. Third gain stage G3 is mechanized by varying C9 from C6, and g3=c9/c6.

Gain factors g1 and g2 have been described as though only the first delay element had capacitors of different values. This is the preferred solution, with all capacitors of the second delay element having the same value; this shifts more of the noise out of the passband and into the bands of no interest. If desired, however, the internal gain of each delay element may be set to any desired value (limited only by the ability to manufacture capacitors of different values), and the gain of the filter will be the product of the gains of the delay elements which lie between the output of the summer and the output of the filter. Gain factor g3 may not be distributed over both delay elements of BPF2; it is uniquely determined by the ratio of c9 to c6.

The foregoing description is exemplary only and does not limit the true spirit and scope of the present invention; these are limited only by the appended claims and their equivalents.

What is claimed is:

1. A single bit bandpass analog-to-digital converter comprising:
   (a) an analog summer connected for receiving, at a plus input terminal, analog input signals;
   (b) an analog gain stage connected for receiving analog signals from the summer;
   (c) an analog bandpass filter connected for receiving analog signals from the gain stage, the analog bandpass filter comprising:
      (1) an analog summer connected for receiving, at a plus input terminal, analog input signals;
      (2) a first delay element, connected for receiving an analog signal from the summer, and constructed for delaying the signal for one delay interval determined, by a digital clock; and
      (3) a second delay element, connected for receiving an analog signal from the first delay element, and connected for delivering analog signals to a minus input terminal of the summer, and constructed for delaying the signal for one delay interval determined by the clock;
   (d) an output terminal connected for producing analog output signals is located at an output terminal of one of a group consisting of the summer, the first delay element, and the second delay element;
   (e) a single bit analog-to-digital converter connected for receiving analog signals from the bandpass filter, and connected for producing digital output signals; and
   (f) a digital-to-analog converter connected for receiving digital signals from the analog-to-digital converter, and connected for driving a minus input terminal of the summer, thereby forming a loop, the delay around the loop totaling two clock cycles.

2. A single bit bandpass analog-to-digital converter comprising:
   (a) an analog summer connected for receiving, at a plus input terminal, analog input signals;
   (b) an analog gain stage connected for receiving analog signals from the summer;
   (c) an analog bandpass filter connected for receiving analog signals from the gain stage, wherein:
      (1) the analog bandpass filter comprises:
         (A) an analog summer connected for receiving, at a plus input terminal, analog input signals;
         (B) a first delay element, connected for receiving an analog signal from the summer, and constructed for delaying the signal for one delay interval determined by a two phase non-overlapping digital clock;
         (C) a second delay element, connected for receiving an analog signal from the first delay element, and connected for delivering analog signals to a minus input terminal of the summer, and constructed for delaying the signal for one delay interval determined by the clock; and
         (D) an output terminal connected for producing analog output signals located at an output terminal of one of a group consisting of the summer, the first delay element, and the second delay element;
      (2) at least one of the delay elements comprises a first half-delay element and a second half-delay element, each half-delay element being constructed for delaying the signal for one-half of the delay interval determined by the clock; and
      (3) the output terminal of said delay element is located at an output terminal of a group consisting of the first half-delay element and the second half-delay element;
   (d) a single bit analog-to-digital converter connected for receiving analog signals from the bandpass filter, and connected for producing digital output signals; and
   (e) a digital-to-analog converter connected for receiving digital signals from the analog-to-digital converter, and connected for driving a minus input terminal of the summer, thereby forming a loop, the delay around the loop totaling two clock cycles.

3. The converter of claim 2, wherein:
   (a) each delay element which comprises a first half-delay element and a second half-delay element further comprises:
      (1) a first Q1 switch connected to receive an input signal;
      (2) a first capacitor connected, at an input side, to the first Q1 switch;
      (3) a first Q2 switch connected between ground and the input side of the first capacitor;
      (4) a second Q1 switch connected between ground and an output side of the first capacitor;
      (5) a second Q2 switch connected between the output side of the first capacitor and an input to an op amp;
      (6) a second capacitor connected, at an input side, to the op amp input;
      (7) a third Q1 switch connected between ground and the output side of the second capacitor;
      (8) a third Q2 switch connected between the output side of the second capacitor and an output to the op amp, the output of the op amp producing an output signal;
      (9) a fourth Q1 switch connected between the output of the op amp and an output side of a third capacitor;
      (10) a fourth Q2 switch connected between ground and the output side of the third capacitor;
      (11) a fifth Q1 switch connected between an input side of the third capacitor and the input side of the second capacitor; and
      (12) a fifth Q2 switch connected between ground and the input side of the third capacitor; and
   (b) each Q1 switch is closed during a first phase of the two phase clock and each Q2 switch is closed during a second phase of the two phase clock.

4. The converter of claim 3, wherein:
   (a) the op amp is a differential op amp having two sides; and
   (b) the set of inputs, switches, capacitors, and outputs of claim 3 are duplicated, one set on each side of the op amp.

5. A single bit bandpass analog-to-digital converter comprising:
   (a) a first analog summer connected for receiving, at a plus input terminal, analog input signals;
   (b) a first analog gain stage connected for receiving analog signals from the first summer;
   (c) a first analog bandpass filter connected for receiving analog signals from the first gain stage;

(d) a second analog summer connected for receiving, at a plus input terminal, analog signals from the first bandpass filter;

(e) a second analog gain stage connected for receiving analog signals from the second summer;

(f) a second analog bandpass filter connected for receiving analog signals from the second gain stage;

(g) a single bit analog-to-digital converter connected for receiving analog signals from the second analog bandpass filter, and connected for producing digital output signals;

(h) a digital-to-analog converter connected for receiving digital signals from the analog-to-digital converter, and connected for delivering analog signals to a minus input terminal of the first summer, thereby forming a large loop; and (i) a third gain stage connected for receiving analog signals from the digital- to-analog converter, and connected for delivering analog signals to a minus input terminal of the second summer, thereby forming a small loop.

6. The converter of claim 5, wherein:

(a) each bandpass filter comprises:

(1) an analog summer connected for receiving, at a plus input terminal, analog input signals;

(2) a first delay element, connected for receiving an analog signal from the summer, and constructed for delaying the signal for one delay interval determined by a digital clock; and (3) a second delay element, connected for receiving an analog signal from the first delay element, and connected for delivering analog signals to a minus input terminal of the summer, and constructed for delaying the signal for one delay interval determined by the clock;

(b) an output terminal connected for producing analog output signals is located at an output terminal of one of a group consisting of the summer, the first delay element, and the second delay element;

(c) the delay around the small loop totals two clock cycles.

7. A single bit bandpass analog-to-digital converter comprising:

(a) a first analog summer connected for receiving, at a plus input terminal, analog input signals;

(b) a first analog gain stage connected for receiving analog signals from the first summer;

(c) a first analog bandpass filter connected for receiving analog signals from the first gain stage wherein:

(1) the first analog bandpass filter comprises:

(A) a first filter analog summer connected for receiving, at a plus input terminal, analog input signals;

(B) a first filter first delay element, connected for receiving an analog signal from the first filter analog summer, and constructed for delaying the signal for one delay interval determined by a two phase non-overlapping digital clock;

(C) a first filter second delay element, connected for receiving an analog signal from the first filter first delay element, and connected for delivering analog signals to a minus input terminal of the first filter analog summer, and constructed for delaying the signal for one delay interval determined by the clock; and (D) a first filter output terminal connected for producing analog output signals located at an output terminal of one of a group consisting of the first filter analog summer, the first filter first delay element, and the first filter second delay element;

(2) at least one of the first filter delay elements comprises a first filter first half-delay element and a first filter second half-delay element, each first filter half-delay element being constructed for delaying the signal for one-half of the delay interval determined by the clock; and (3) the output terminal of said first filter delay element is located at an output terminal of a group consisting of the first filter first half-delay element and the first filter second half-delay element;

(d) a second analog summer connected for receiving, at a plus input terminal, analog signals from the first bandpass filter;

(e) a second analog gain stage connected for receiving analog signals from the second summer;

(f) a second analog bandpass filter connected for receiving analog signals from the second gain stage wherein:

(1) the second analog bandpass filter comprises:

(A) a second filter analog summer connected for receiving, at a plus input terminal, analog input signals;

(B) a second filter first delay element, connected for receiving an analog signal from the second filter analog summer, and constructed for delaying the signal for one delay interval determined by the clock;

(C) a second filter second delay element, connected for receiving an analog signal from the second filter first delay element, and connected for delivering analog signals to a minus input terminal of the second filter analog summer, and constructed for delaying the signal for one delay interval determined by the clock; and (D) a second filter output terminal connected for producing analog output signals located at an output terminal of one of a group consisting of the second filter analog summer, the second filter first delay element, and the second filter second delay element;

(2) at least one of the second filter delay elements comprises a second filter first half-delay element and a second filter second half-delay element, each second filter half-delay element being constructed for delaying the signal for one-half of the delay interval determined by the clock; and (3) the output terminal of said second filter delay element is located at an output terminal of a group consisting of the second filter first half-delay element and the second filter second half-delay element;

(g) a single bit analog-to-digital converter connected for receiving analog signals from the second analog bandpass filter, and connected for producing digital output signals;

(h) a digital-to-analog converter connected for receiving digital signals from the analog-to-digital converter, and connected for delivering analog signals to a minus input terminal of the first summer, thereby forming a large loop, the delay around the large loop totaling two clock cycles; and (i) a third gain stage connected for receiving analog signals from the digital-to-analog converter, and connected for delivering analog signals to a minus input terminal of the second summer, thereby forming a small loop, the gain of the third gain stage being approximately equal to the gain of the first gain stage.

8. The converter of claim 7, wherein:

(a) the clock is a two phase non-overlapping clock;

(b) at least one of the delay elements comprises a first half-delay element and a second half-delay element, each half-delay element being constructed for delaying the signal for one-half of the delay interval determined by the clock; and (c) the output terminal of said delay element is located at an output terminal of a group consisting of the first half-delay element and the second half-delay element.

9. The converter of claim 8, wherein:

(a) each delay element which comprises a first half-delay element and a second half-delay element further comprises:

(1) a first Q1 switch connected to receive an input signal;

(2) a first capacitor connected, at an input side, to the first Q1 switch;

(3) a first Q2 switch connected between ground and the input side of the first capacitor;

(4) a second Q1 switch connected between ground and an output side of the first capacitor;

(5) a second Q2 switch connected between the output side of the first capacitor and an input to an op amp;

(6) a second capacitor connected, at an input side, to the op amp input;

(7) a third Q1 switch connected between ground and the output side of the second capacitor;

(8) a third Q2 switch connected between the output side of the second capacitor and an output to the op amp, the output of the op amp producing an output signal;

(9) a fourth Q1 switch connected between the output of the op amp and an output side of a third capacitor;

(10) a fourth Q2 switch connected between ground and the output of the third capacitor;

(11) a fifth Q1 switch connected between an input side of the third capacitor and the input side of the second capacitor; and (12) a fifth Q2 switch connected between ground and the input side of the third capacitor; and (b) each Q1 switch is closed during a first phase of the two phase clock and each Q2 switch is closed during a second phase of the two phase clock.

10. The converter of claim 9, wherein:

(a) the op amp is a differential op amp having two sides; and (b) the set of inputs, switches, capacitors, and outputs of claim 9 are duplicated, one set on each side of the op amp.

11. A single bit bandpass analog-to-digital converter comprising:

(a) a first analog summer connected for receiving, at a plus input terminal, analog input signals;

(b) a first analog gain stage connected for receiving analog signals from the first summer;

(c) a first analog bandpass filter connected for receiving analog signals from the first gain stage wherein:

(1) the first analog bandpass filter comprises:

(A) a first filter analog summer connected for receiving, at a plus input terminal, analog input signals;

(B) a first filter first delay element, connected for receiving an analog signal from the first filter analog summer, and constructed for delaying the signal for one delay interval determined by a two phase non-overlapping digital clock;

(C) a first filter second delay element, connected for receiving an analog signal from the first filter first delay element, and connected for delivering analog signals to a minus input terminal of the first filter analog summer, and constructed for delaying the signal for one delay interval determined by the clock; and (D) a first filter output terminal connected for producing analog output signals located at an output terminal of one of a group consisting of the first filter analog summer, the first filter first delay element, and the first filter second delay element;

(2) at least one of the first filter delay elements comprises a first filter first half-delay element and a first filter second half-delay element, each first filter half-delay element being constructed for delaying the signal for one-half of the delay interval determined by the clock; and (3) the output terminal of said first filter delay element is located at an output terminal of a group consisting of the first filter first half-delay element and the first filter second half-delay element;

(d) a second analog summer connected for receiving, at a plus input terminal, analog signals from the first bandpass filter;

(e) a second analog gain stage connected for receiving analog signals from the second summer;

(f) a second analog bandpass filter connected for receiving analog signals from the second gain stage wherein:

(1) the second analog bandpass filter comprises:

(A) a second filter analog summer connected for receiving, at a plus input terminal, analog input signals;

(B) a second filter first delay element, connected for receiving an analog signal from the second filter analog summer, and constructed for delaying the signal for one delay interval determined by the clock;

(C) a second filter second delay element, connected for receiving an analog signal from the second filter first delay element, and connected for delivering analog signals to a minus input terminal of the second filter analog summer, and constructed for delaying the signal for one delay interval determined by the clock; and (D) a second filter output terminal connected for producing analog output signals located at an output terminal of one of a group consisting of the second filter analog summer, the second filter first delay element, and the second filter second delay element;

(2) at least one of the second filter delay elements comprises a second filter first half-delay element and a second filter second half-delay element, each second filter half-delay element being constructed for delaying the signal for one-half of the delay interval determined by the clock; and (3) the output terminal of said second filter delay element is located at an output terminal of a group consisting of the second filter first half-delay element and the second filter second half-delay element;

(g) a single bit analog-to-digital converter connected for receiving analog signals from the second analog bandpass filter, and connected for producing digital output signals;

(h) a digital-to-analog converter connected for receiving digital signals from the analog-to-digital converter, and connected for delivering analog signals to a minus input terminal of the first summer, thereby forming a large loop, the delay around the large loop totaling four clock cycles; and (i) a third gain stage connected for receiving analog signals from the digital- to-analog converter, and connected for delivering analog signals to a minus input terminal of the second summer, thereby forming a small loop, the gain of the third gain stage being approximately equal to minus twice the gain of the first gain stage.

12. The converter of claim 11, wherein:

(a) the clock is a two phase non-overlapping clock;

(b) at least one of the delay elements comprises a first half-delay element and a second half-delay element, each half-delay element being constructed for delaying the signal for one-half of the delay interval determined by the clock; and (c) the output terminal of said delay element is located at an output terminal of a group consisting of the first half-delay element and the second half-delay element.

13. The converter of claim 12, wherein:

(a) each delay element which comprises a first half-delay element and a second half-delay element further comprises:

(1) a first Q1 switch connected to receive an input signal;

(2) a first capacitor connected, at an input side, to the first Q1 switch;

(3) a first Q2 switch connected between ground and the input side of the first capacitor;

(4) a second Q1 switch connected between ground and an output side of the first capacitor;

(5) a second Q2 switch connected between the output side of the first capacitor and an input to an op amp;

(6) a second capacitor connected, at an input side, to the op amp input;

(7) a third Q1 switch connected between ground and the output side of the second capacitor;

(8) a third Q2 switch connected between the output side of the second capacitor and an output to the op amp, the output of the op amp producing an output signal;

(9) a fourth Q1 switch connected between the output of the op amp and an output side of a third capacitor;

(10) a fourth Q2 switch connected between ground and the output of the third capacitor;

(11) a fifth Q1 switch connected between an input side of the third capacitor and the input side of the second capacitor; and (12) a fifth Q2 switch connected between ground and the input side of the third capacitor; and (b) each Q1 switch is closed during a first phase of the two phase clock and each Q2 switch is closed during a second phase of the two phase clock.

14. The converter of claim 13, wherein:

(a) the op amp is a differential op amp having two sides; and (b) the set of inputs, switches, capacitors, and outputs of claim 13 are duplicated, one set on each side of the op amp.

* * * * *